US007759255B2

(12) United States Patent
Hamamoto et al.

(10) Patent No.: US 7,759,255 B2
(45) Date of Patent: Jul. 20, 2010

(54) SEMICONDUCTOR DEVICE AND METHOD FOR MANUFACTURING THE SAME

(75) Inventors: Takeshi Hamamoto, Yokohama (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 751 days.

(21) Appl. No.: 11/561,700

(22) Filed: Nov. 20, 2006

(65) Prior Publication Data
US 2007/0215943 A1 Sep. 20, 2007

(30) Foreign Application Priority Data
Mar. 17, 2006 (JP) ............................. 2006-074769

(51) Int. Cl.
*H01L 21/31* (2006.01)
*H01L 21/469* (2006.01)
*H01L 21/8239* (2006.01)

(52) U.S. Cl. ............... 438/739; 438/700; 257/E21.561; 257/E21.546; 257/E21.564

(58) Field of Classification Search ................ 438/700, 438/739; 257/E21.561, E21.564
See application file for complete search history.

(56) References Cited

U.S. PATENT DOCUMENTS

| | | | | |
|---|---|---|---|---|
| 7,338,848 | B1* | 3/2008 | Kempf | 438/202 |
| 2003/0119228 | A1* | 6/2003 | Oyamatsu | 438/149 |
| 2003/0151112 | A1* | 8/2003 | Yamada et al. | 257/510 |
| 2004/0058506 | A1* | 3/2004 | Fukuzumi | 438/422 |
| 2004/0155296 | A1* | 8/2004 | Kim et al. | 257/374 |
| 2005/0179073 | A1* | 8/2005 | Lee et al. | 257/296 |
| 2005/0218395 | A1* | 10/2005 | Kim et al. | 257/12 |
| 2005/0260816 | A1* | 11/2005 | Orlowski | 438/283 |
| 2006/0186446 | A1* | 8/2006 | Kim et al. | 257/296 |
| 2006/0231893 | A1* | 10/2006 | Bernstein et al. | 257/347 |
| 2006/0231899 | A1* | 10/2006 | Chang et al. | 257/368 |

FOREIGN PATENT DOCUMENTS

JP 2005-303305 10/2005

OTHER PUBLICATIONS

Sung-Min Kim, et al., "A Study on Selective $Si_{0.8}Ge_{0.2}$ ETCH Using Polysilicon Etchant Diluted by $H_2O$ for Three-Dimensional Si Structure Application", The Proceedings of the 11$^{th}$ International Symposium on SOI Technology and Devices, Electrochemical Society Proceedings vol. 2003-05, pp. 81-86.
Kyoung Hwan Yeo, et al., "80 nm 512M DRAM with Enhanced Data Retention Time Using Partially-Insulated Cell Array Transistor (PiCAT)", 2004 Symposium on VLSI Technology Digest of Technical Papers, pp. 30-31.

* cited by examiner

*Primary Examiner*—David Vu
*Assistant Examiner*—Earl N Taylor
(74) *Attorney, Agent, or Firm*—Oblon, Spivak, McClelland, Maier & Neustadt, L.L.P.

(57) ABSTRACT

In one embodiment of the present invention, a method for manufacturing a semiconductor device includes: forming a to-be-removed layer on a semiconductor substrate; forming a semiconductor layer on the to-be-removed layer; forming a trench that passes through the semiconductor layer to the to-be-removed layer in an SOI region; removing the to-be-removed layer by using the trench and creating a cavity; and forming an insulating film in the cavity.

7 Claims, 19 Drawing Sheets

SEMICONDUCTOR DEVICE AND METHOD FOR MANUFACTURING THE SAME

CROSS REFERENCE TO RELATED APPLICATIONS

This application is based upon and claims the benefit of priority from the prior Japanese Patent Application No. 2006-74769, filed on Mar. 17, 2006, the entire contents of which are incorporated herein by reference.

BACKGROUND OF THE INVENTION

1. Field of the Invention

This invention relates to a semiconductor device and method for manufacturing it, for example to a semiconductor memory device including capacitorless DRAM memory cells and a method for manufacturing it.

2. Related Art

A conventional DRAM memory cell of a DRAM includes a capacitor for storing signal charges and a switching transistor (for example, a MOSFET or other FETs). Capacitance of the capacitor required to store signal charges is generally about 30 fF. It is necessary to keep this capacitance of the capacitor of about 30 fF for a DRAM to maintain stable operation, even if the reduced design rule for the DRAM is adopted due to improvement in a degree of cell integration. Therefore, the DRAM memory cell of a conventional DRAM generally have required process improvement for miniaturizing a capacitor, such as thinning an insulating film for a capacitor of stack type or trench type.

On the contrary, a capacitorless DRAM has been proposed. In a DRAM memory cell of the capacitorless DRAM, a transistor (for example, a MOSFET or other FETs) is necessary, but a capacitor is not required. Therefore, the DRAM memory cell of the capacitorless DRAM may have less possibility to hinder improvement in a degree of cell integration.

A specific example of the capacitorless DRAM memory cell includes an FBC (Floating Body Cell) described in Japanese Patent Laid-Open No. 2002-246571. The FBC described in Japanese Patent Laid-Open No. 2002-246571 includes an FET formed on an SOI substrate. To realize the memory cell, the FBC described in Japanese Patent Laid-Open No. 2002-246571 utilizes a phenomenon associated with the change in the threshold voltage of the FET depending on whether or not holes are present in the channel region of the FET.

We will consider a case where an FBC is used as a memory cell, and the memory cell and an element other than a memory cell are formed on a substrate. In this case, it is conceivable to provide an SOI region and a bulk region on a SOI substrate, to form the memory cell and the element other than a memory cell on the SOI region and the bulk region respectively. This allows a device structure having the memory cell and the element other than a memory cell, as if they were formed on a typical SOI substrate and a typical bulk substrate respectively.

The above device structure has the following advantages over a device structure in which a memory cell and an element other than a memory cell are formed on a typical SOI substrate. Firstly, it is not necessary to alter design environment (such as a SPICE MODEL) of the element other than a memory cell, from that for a bulk substrate to that for an SOI substrate, allowing improved device development efficiency. Secondly, high voltage transistor characteristics and ESD characteristics of an input/output circuit and the like of the element other than a memory cell are improved. Thirdly, the above-mentioned device structure ensures specification continuity with a conventional device structure in which the element other than a memory cell is formed on a typical bulk substrate.

When an FBC is used as a memory cell, and the memory cell and an element other than a memory cell are formed on a substrate, employing a typical SOI substrate as the substrate and employing a special SOI substrate having an SOI region and a bulk region as the substrate have a common feature that an SOI substrate needs to be prepared. The former SOI substrate can be prepared, for example, by purchasing a commercially available SOI substrate. The latter SOI substrate can be prepared, for example, by converting part of the SOI region in a commercially available SOI substrate into a bulk region using a semiconductor process.

However, a commercially available SOI substrate is extremely expensive compared to a commercially available bulk substrate. At present, a commercially available SOI substrate costs approximately 5 to 10 times higher than a commercially available bulk substrate. On the other hand, when a substrate similar to a commercially available SOI substrate is manufactured in house using a similar process for manufacturing a commercially available SOI substrate, tremendous efforts will be required.

Therefore, when an FBC is used as a memory cell, and the memory cell and an element other than a memory cell are formed on a substrate, although employing the latter SOI substrate as the substrate, instead of employing the former SOI substrate, is conceivably very effective, the cost and effort associated with preparing the SOI substrate becomes a bottleneck.

This problem of the cost and effort associated with preparing an SOI substrate similarly becomes a bottleneck, when a memory cell is formed on an SOI substrate but an element other than a memory cell is not formed thereon.

SUMMARY OF THE INVENTION

An embodiment of the present invention relates to, for example, a method for manufacturing a semiconductor device including: forming a to-be-removed layer on a semiconductor substrate; forming a semiconductor layer on the to-be-removed layer; forming a trench that passes through the semiconductor layer to the to-be-removed layer in an SOI region; removing the to-be-removed layer by using the trench and creating a cavity; and forming an insulating film in the cavity.

Another embodiment of the present invention relates to, for example, a method for manufacturing a semiconductor device including: forming a to-be-removed layer on a semiconductor substrate; removing a part of the to-be-removed layer from an SOI region; after removing the part of the to-be-removed layer in the SOI region, forming a semiconductor layer on the to-be-removed layer; forming a trench that passes through the semiconductor layer to the to-be-removed layer in the SOI region; removing the to-be-removed layer by using the trench and creating a cavity; and forming an insulating film in the cavity.

Another embodiment of the present invention relates to, for example, a semiconductor device including: a semiconductor layer formed in an SOI region on a semiconductor substrate; an insulating film formed between the semiconductor substrate and the semiconductor layer in the SOI region; a memory cell formed on the semiconductor layer; and linear isolation layers formed in the SOI region, the insulating film and the semiconductor layer being formed between the isolation layers.

DETAILED DESCRIPTION OF THE INVENTION

First Embodiment

Figure 1:
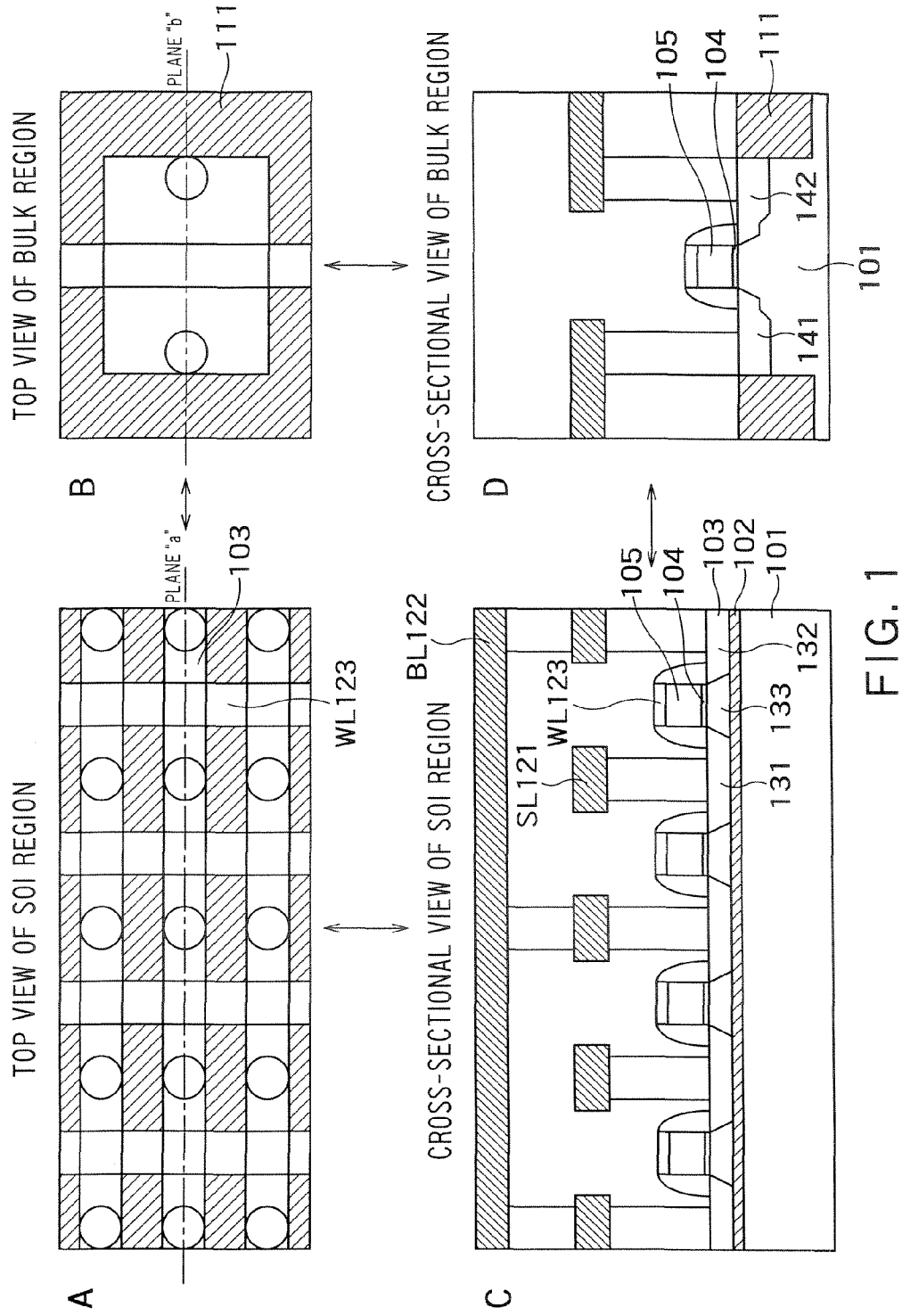
FIG. 1 shows the semiconductor memory device according to the first embodiment.

FIG. 1 shows a semiconductor memory device according to a first embodiment. FIGS. 1A and 1B are top views of the semiconductor memory device. FIGS. 1C and 1D are cross-sectional views of the semiconductor memory device taken along the planes "a" and "b", respectively.

A substrate of the semiconductor memory device in FIG. 1 has an SOI region where a memory transistor is formed and a bulk region where a logic transistor is formed. FIGS. 1A and 1C show the SOI region and FIGS. 1B and 1D show the bulk region. In this embodiment, both the memory and logic transistors are FETs (MOSFETs in this embodiment). The memory transistor forms a capacitorless DRAM memory cell (FBC).

The semiconductor memory device in FIG. 1 includes a substrate (semiconductor substrate in this embodiment) 101, an insulating film 102, a semiconductor layer 103, a gate insulator film 104, a gate electrode 105, an STI layer 111, a source line (SL) 121, a bit line (BL) 122 and a word line (WL) 123.

The substrate 101, insulating film 102, semiconductor layer 103, gate insulating film 104 and gate electrode 105 are stacked in this order from the bottom layer to the top layer. The word line 123 is shaped into a linear shape extending vertically in the top view. The semiconductor layer 103 is shaped into a linear shape extending horizontally in the top view. The gate insulating film 104 and the gate electrode 105 are formed at the intersecting region of the word line 123 and the semiconductor layer 103.

The SOI region has the insulating layer 102 and the semiconductor layer 103. Therefore, a MOSFET in the SOI region is formed of the semiconductor layer 103, gate insulating film 104 and gate electrode 105. As the components of the MOSFET in the SOI region, the semiconductor layer 103 has a source region 131, a drain region 132, and a body region 133 for storing signal charges. The source region 131 and the source line 121 are directly connected to each other, and the drain region 132 and the bit line 122 are directly connected to each other, while the body region 133 and the word line 123 are indirectly connected to each other.

The bulk region does not have the insulating layer 102 and the semiconductor layer 103. Therefore, a MOSFET in the bulk region is formed of the substrate 101, gate insulating film 104 and gate electrode 105. As the components of the MOSFET in the bulk region, the substrate 101 has a source region 141 and a drain region 142. Since a transistor or the like is directly formed on the semiconductor substrate in the bulk region, elements formed thereon may have excellent properties and may be suitable for a logic circuit.

The insulating film 102 is formed between the substrate 101 and the semiconductor layer 103, by forming a base layer (which will be described later) on the substrate 101; forming the semiconductor layer 103 on the base layer; forming a trench that passes through the semiconductor layer 103 to the base layer; removing the base layer by using the trench; and forming the insulating film 102 in the cavity created by the removal of the base layer. The insulating film 102 is a buried oxide film (BOX film) formed between the substrate 101 and the semiconductor layer 103 in such a process. The base layer corresponds to a specific example of a to-be-removed layer that is formed on the condition that the layer is removed later.

The substrate of the semiconductor memory device according to the first embodiment is an SOI substrate having an SOI region. However, the process for manufacturing the substrate of the semiconductor memory device according to the first embodiment differs from a conventional process for manufacturing an SOI substrate of a semiconductor memory device. In the semiconductor memory device according to the first embodiment, the insulating film 102 that forms part of the substrate (an SOI insulating film that forms part of the SOI substrate) is formed in the process described above.

Thus, when a semiconductor memory device with an SOI substrate is manufactured, the cost and effort to prepare an SOI substrate that forms part of the semiconductor memory device are reduced. In particular, when a memory cell and an element other than a memory cell are formed on a substrate, it is very effective to employ an SOI substrate having an SOI region and a bulk region as the substrate, therefore, the reduction in cost and effort for employing such an SOI substrate would provide significant benefit.

FIGS. 2 to 9 show a method for manufacturing the semiconductor memory device according to the first embodiment. FIGS. A and B in each of the figures are top views of the semiconductor memory device. FIGS. C, D, E and F in each of the figures are cross-sectional views of the semiconductor memory device taken along the planes "a", "b", "c" and "d", respectively.

Figure 2:
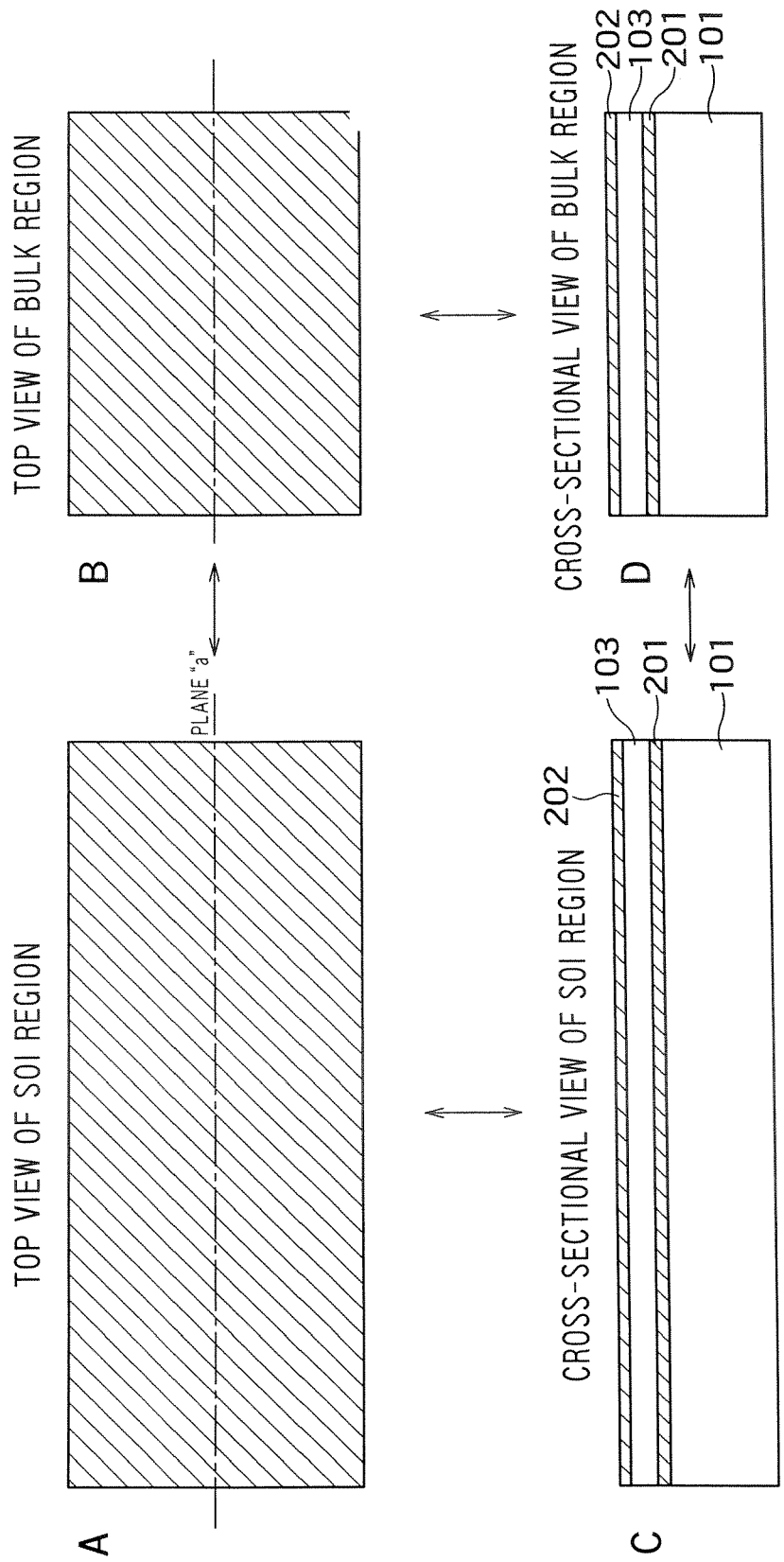
FIG. 2 shows the first stage (1/8) of the method for manufacturing the semiconductor memory device according to the first embodiment.

Firstly, as shown in FIG. 2, a base layer 201 made of SiGe (silicon germanium) is epitaxially grown over the substrate 101 made of Si (silicon). The base layer 201 serves as an underlying layer of layers formed above the substrate 101. The substrate 101 and the base layer 201 serve as a base of layers formed on the base layer 201 on the substrate 101. The layer thickness of the base layer 201 is 25 nm in this embodiment. The molar composition ratio of Si to Ge in the base layer 201 is 70%-80% to 30%-20% in this embodiment. Subsequently, as shown in FIG. 2, the semiconductor layer 103 made of Si is epitaxially grown over the base layer 201 made of SiGe. The layer thickness of the semiconductor layer 103 is 40 nm in this embodiment. Then, as shown in FIG. 2, a mask material (silicon nitride film) 202 is deposited over the semiconductor layer 103 in order to form the SOI and bulk regions.

Figure 3:
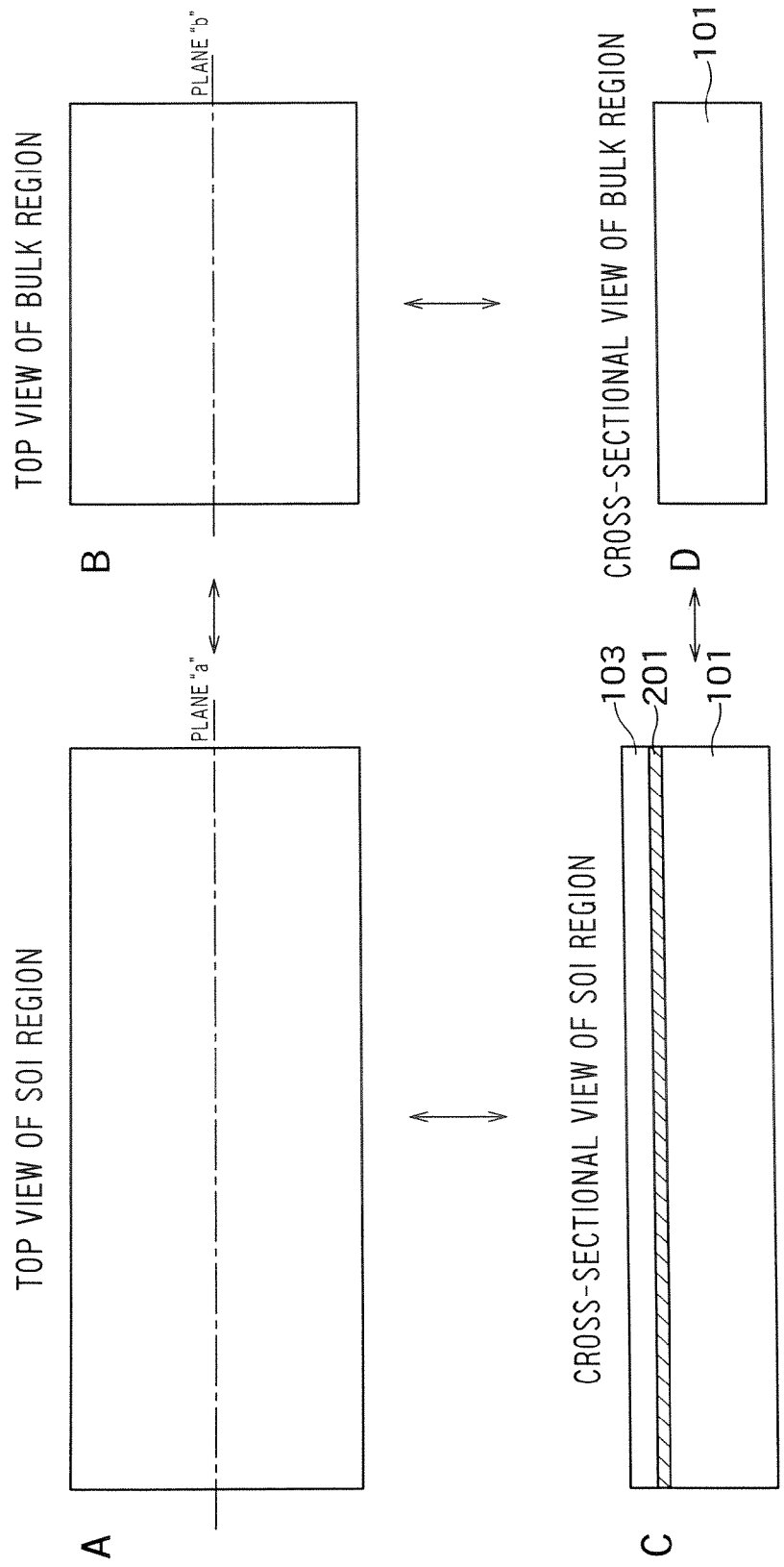
FIG. 3 shows the second stage (2/8) of the method for manufacturing the semiconductor memory device according to the first embodiment.

Thereafter, the mask material 202 is removed from the bulk region by lithography and RIE (reactive ion etching). Then, by using the mask material 202 on the SOI region as a mask, the semiconductor layer 103 and the base layer 201 are etched away from the bulk region in order to expose the surface of the substrate 101 in the bulk region. Subsequently, as shown in FIG. 3, the mask material 202 is removed from the SOI region.

Figure 4:
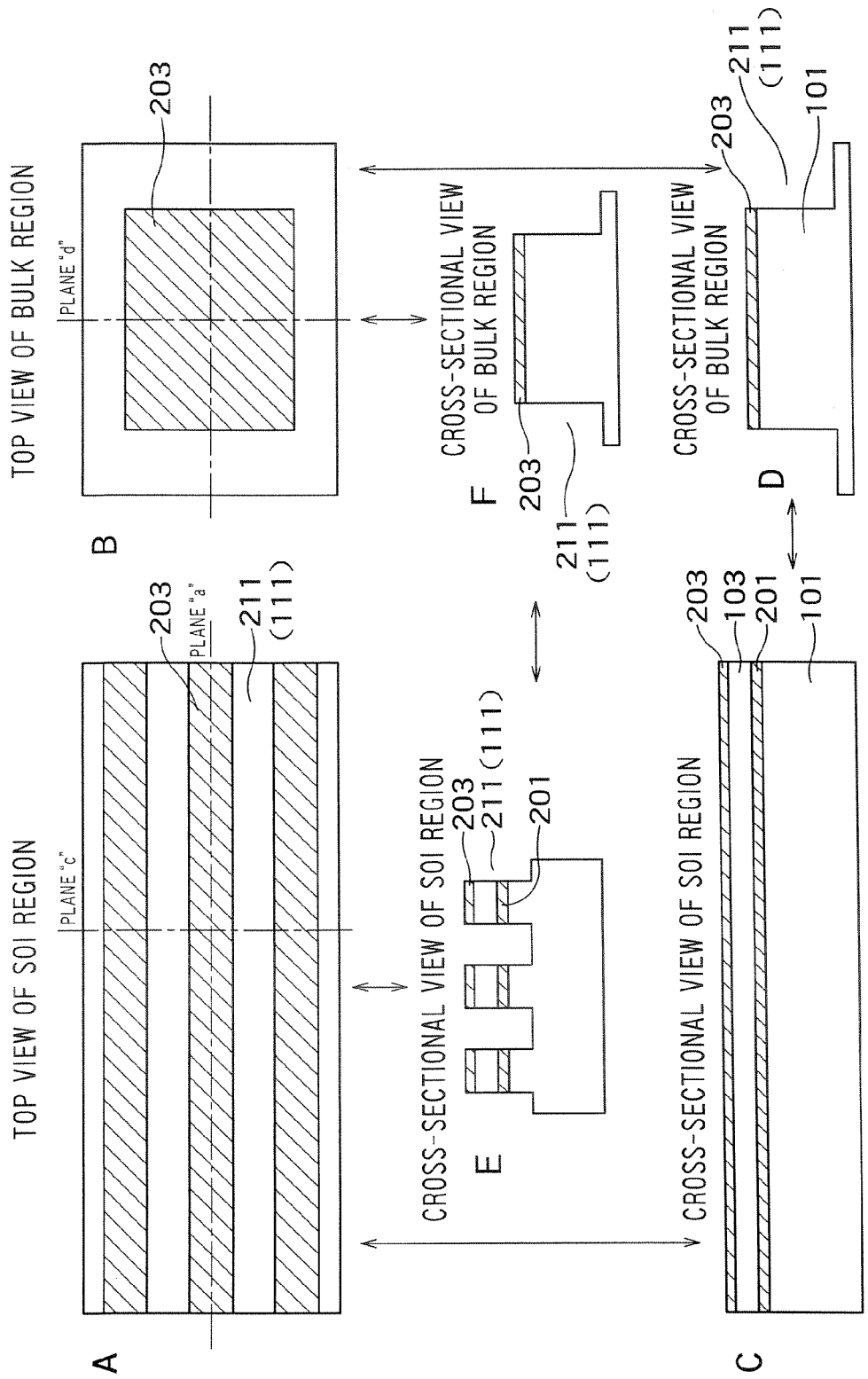
FIG. 4 shows the third stage (3/8) of the method for manufacturing the semiconductor memory device according to the first embodiment.

Thereafter, as shown in FIG. 4, a mask material (silicon nitride film) 203 is deposited over the semiconductor layer 103 in the SOI region and the substrate 101 in the bulk region in order to form a trench 211 for the STI layer 111. Then, as shown in FIG. 4, the mask material 203 is removed from the region where the trench 211 for the STI layer 111 is formed by lithography and RIE. Then, as shown in FIG. 4, by RIE using the mask material 203 as a mask, the semiconductor layer 103, base layer 201 and substrate 101 are etched away from that region to form the trench 211 that passes through the semiconductor layer 103 and the base layer 201 in that region. This exposes the base layer 201 at the sides of the trench 211 in the SOI region. At this time, the trench 211 may or may not pass through the base layer 201 as long as the trench 211 reaches the base layer 201.

Figure 5:
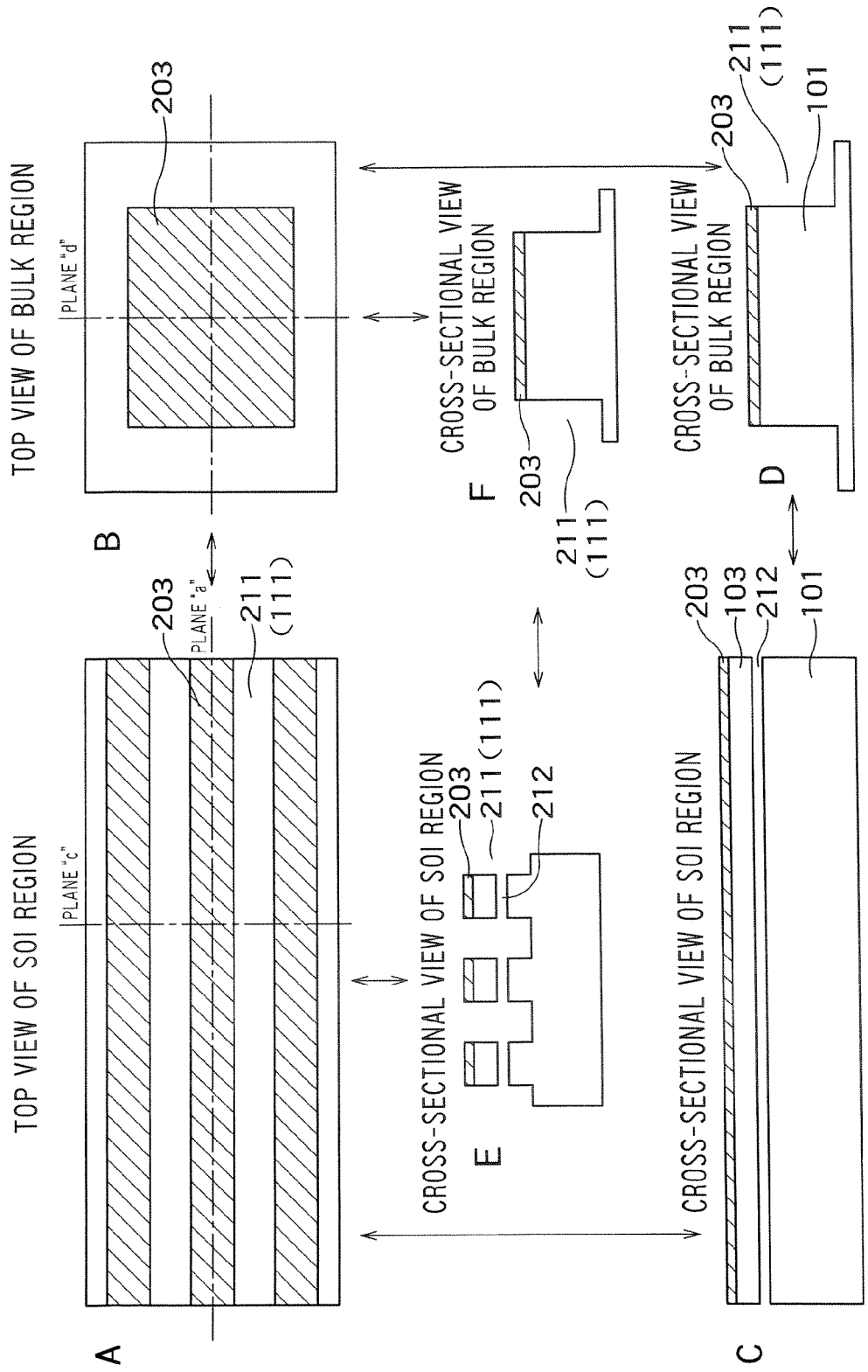
FIG. 5 shows the fourth stage (4/8) of the method for manufacturing the semiconductor memory device according to the first embodiment.

Thereafter, as shown in FIG. 5, the base layer 201 is etched away by using the trench 211 that passes through the semiconductor layer 103 and the base layer 201. In this embodiment, the substrate 101 is immersed in an etchant to etch away the entire base layer 201 from the sides of the trench 211 in the SOI region. In this embodiment, the etchant is a mixed aqueous solution containing 40 volumetric parts of 70% concentration nitric acid aqueous solution, 1 volumetric part of 49% concentration hydrofluoric acid aqueous solution, 2 volumetric parts of 99.9% concentration acetic acid aqueous solution and 57 volumetric parts of water (see, S. M. Kim, et al., ECS, The proceedings of the 11th International Symposium on SOI Technology and Devices, page 81, 2003). Thus, the cavity 212 is formed between the substrate 101 and the semiconductor layer 103 in the SOI region.

Figure 6:
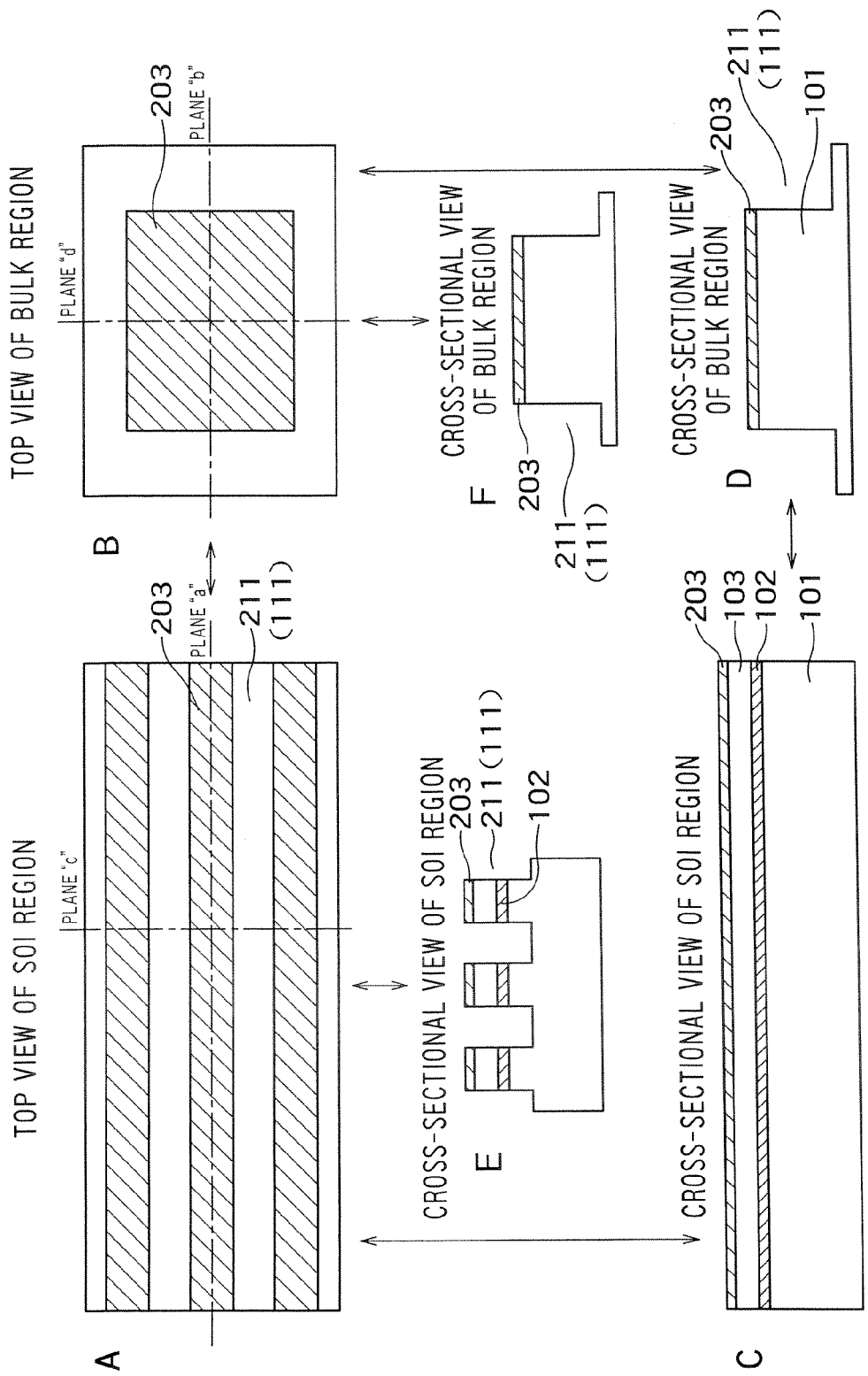
FIG. 6 shows the fifth stage (5/8) of the method for manufacturing the semiconductor memory device according to the first embodiment.

Thereafter, as shown in FIG. 6, the entire surface is oxidized to grow silicon oxide films on the surfaces of the cavity 212 and the trench 211 in the SOI region. This silicon oxide film is the insulating film 102 described above. In this embodiment, the cavity 212 in the SOI region can be completely filled with the silicon oxide film by setting the film thickness thereof to 13 nm. Thus, the insulating film 102 is formed in the cavity 212 between the substrate 101 and the semiconductor layer 103 in the SOI region.

Figure 7:
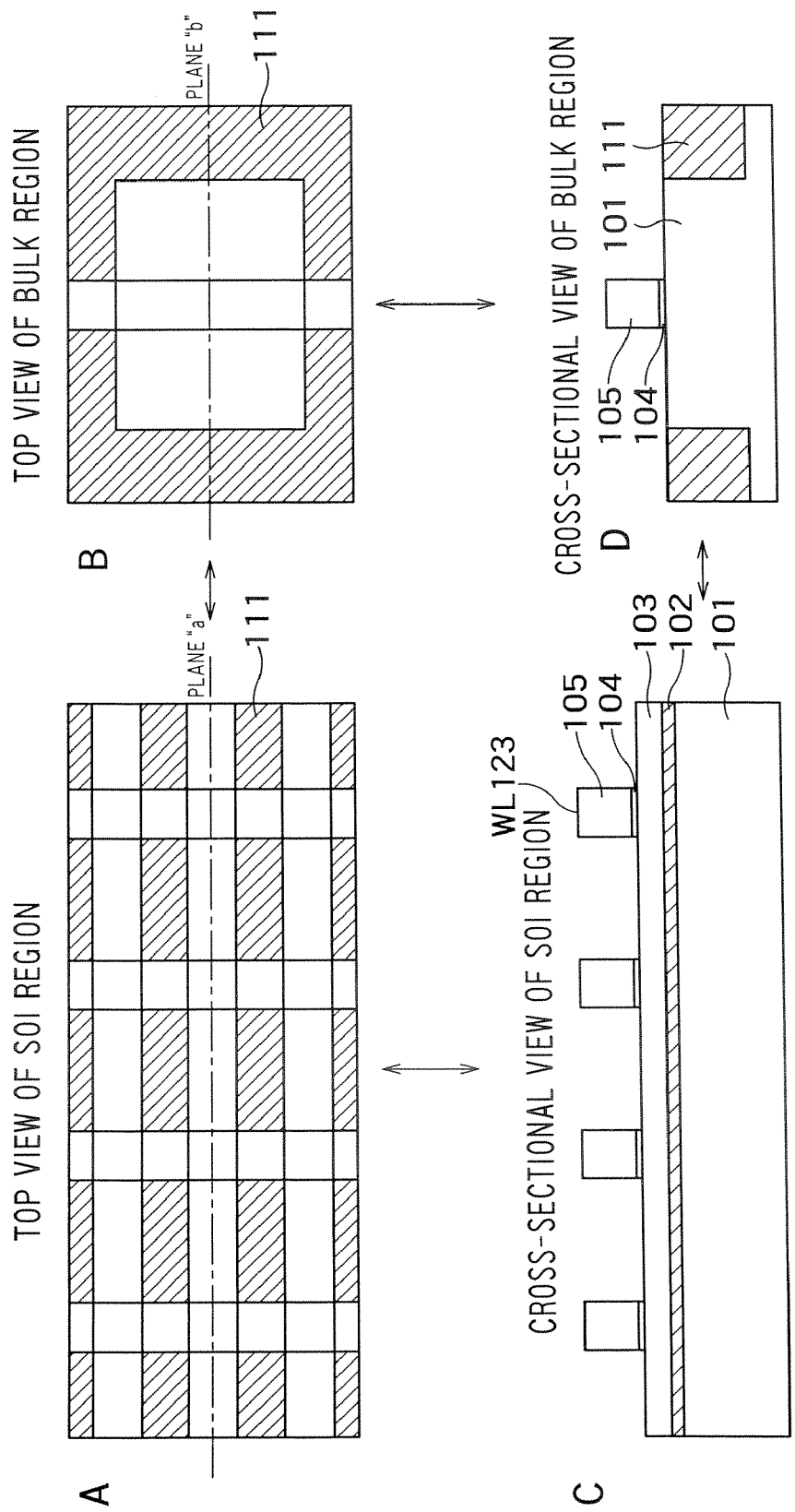
FIG. 7 shows the sixth stage (6/8) of the method for manufacturing the semiconductor memory device according to the first embodiment.
Figure 8:
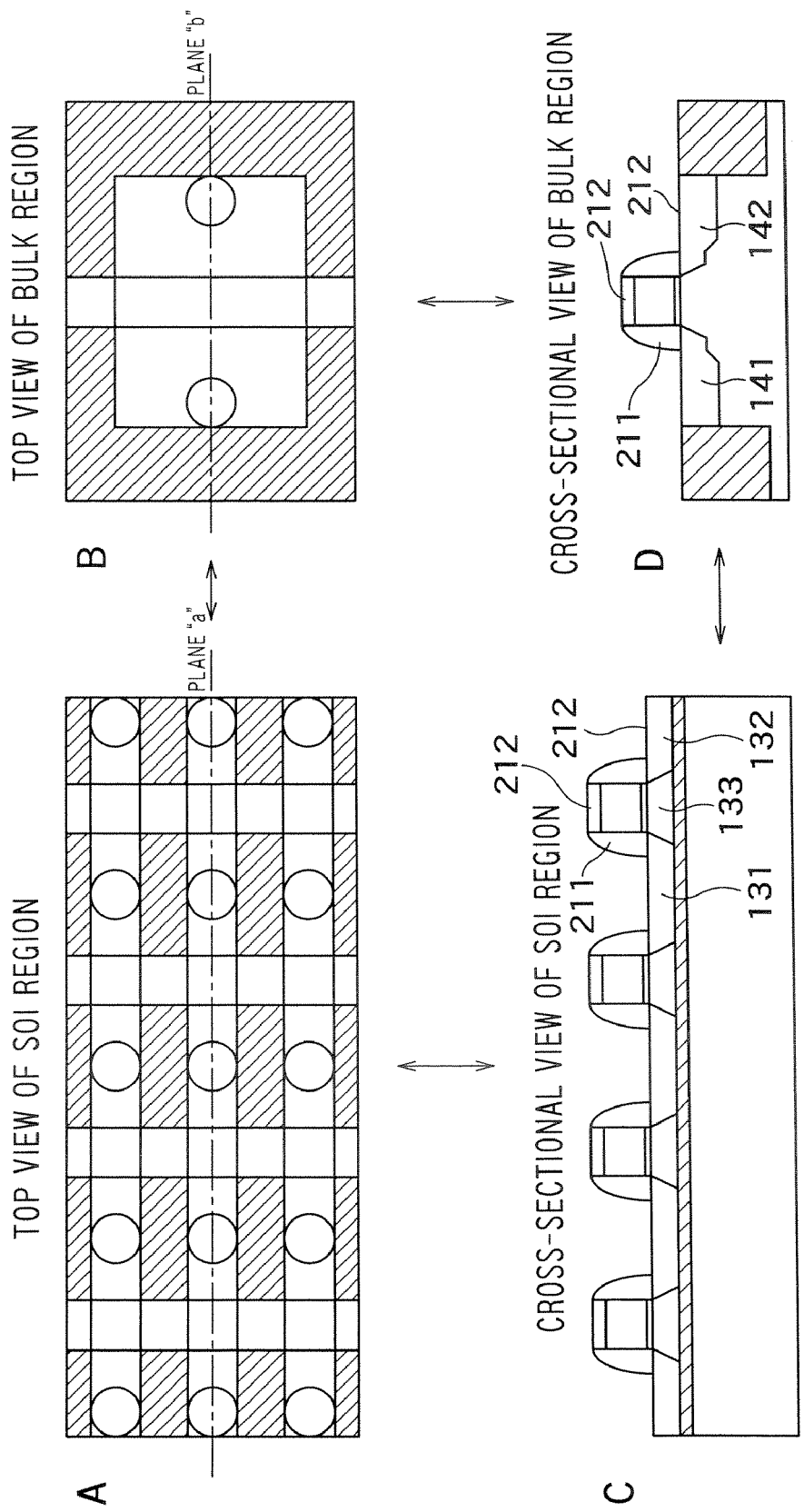
FIG. 8 shows the seventh stage (7/8) of the method for manufacturing the semiconductor memory device according to the first embodiment.
Figure 9:
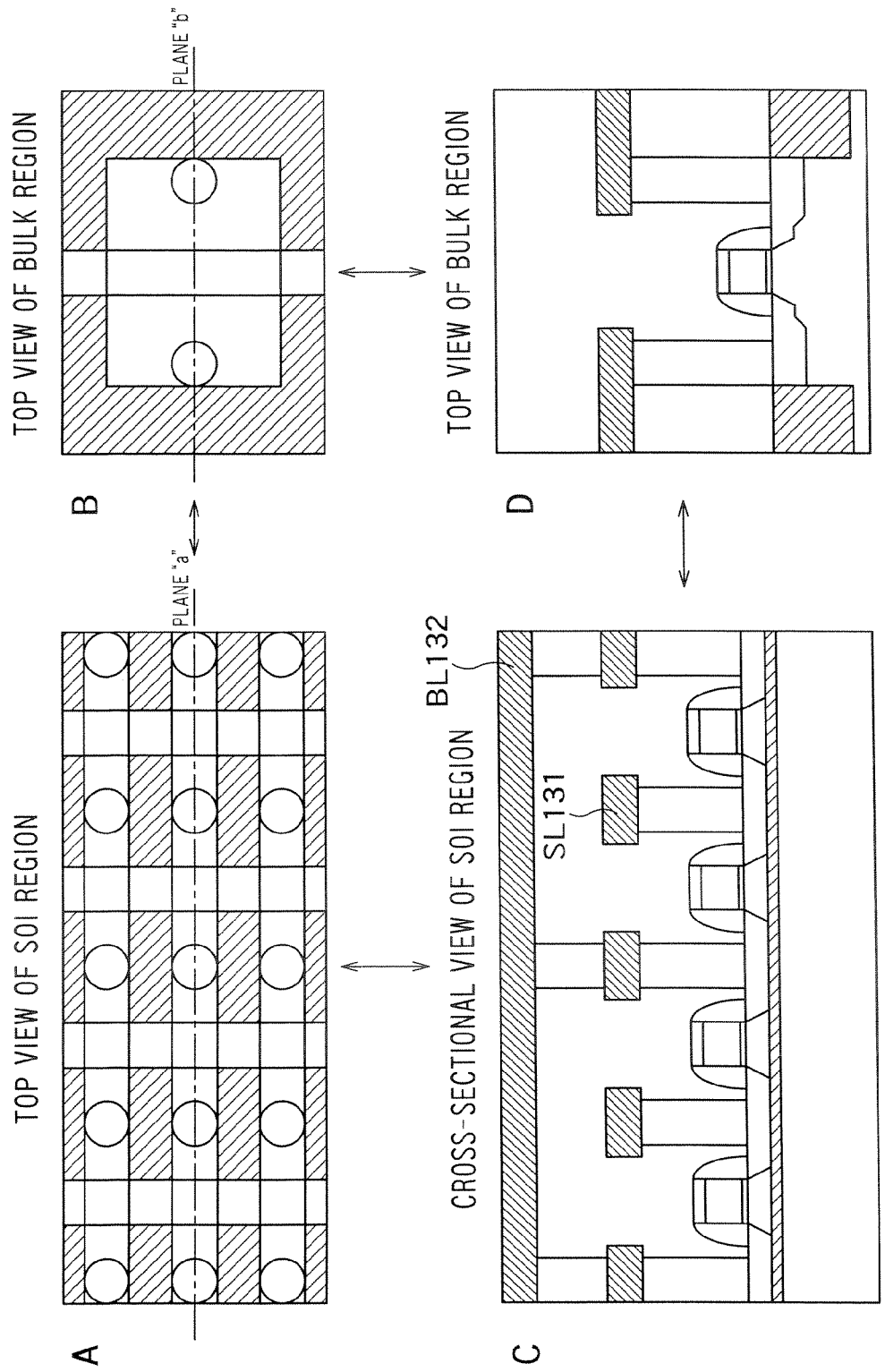
FIG. 9 shows the eighth stage (8/8) of the method for manufacturing the semiconductor memory device according to the first embodiment.

Thereafter, as shown in FIG. 7, the STI layer 111 is formed by burying and planarizing the silicon oxide film in the trench 211 for the STI layer 111. In this process, the mask 203 is also removed. Then, as shown in FIG. 7, a silicon oxide film and polycrystalline silicon are deposited, and lithography and RIE are used to form the gate insulating film 104 and the gate electrode 105 (word line 123). Subsequently, as shown in FIG. 8, n-type source and drain regions 131 and 132 are formed in the semiconductor layer 103 in the SOI region, and n-type source and drain regions 141 and 142 are formed in the substrate 101 in the bulk region. Then, as shown in FIG. 8, LDD side walls 221 and a CoSi film 222 are formed. Subsequently, as shown in FIG. 9, the source line 121 and the bit line 122 are formed. Thus, MOSFETs are formed on the semiconductor layer 103 in the SOI region and on the substrate 101 in the bulk region.

In the first embodiment, a plurality of rows of linear trenches 211 are formed on the substrate 101, as shown in FIG. 4, in order to form a plurality of rows of linear STI layers 111 on the substrate 101, as shown in FIG. 7. Thus, the insulating film 102 and the semiconductor layer 103 are present between the trenches 211 in the process stage shown in FIG. 6 (see FIG. 6E), and ultimately present between the STI layers 111. Then, the memory transistor is formed on the semiconductor layer 103 that is present between the STI layers 111, as shown in FIGS. 7A, 8A and 9A. The memory transistor may be formed before or after the STI layer 111 is formed. In the first embodiment, such a characteristic structure results from the specificity of the method for manufacturing a semiconductor memory device. The STI (Shallow Trench Isolation) layer 111 corresponds to a specific example of an isolation layer for separating transistors.

Furthermore, in the first embodiment, the height of the lower side of the gate insulating film 104 that forms a part of the memory transistor (that is, the height of the interface between the gate insulating film 104 and the semiconductor layer 103, see FIG. 1C) is higher than the height of the lower side of the gate insulating film 104 that forms a part of the logic transistor (that is, the height of the interface between the gate insulating film 104 and the substrate 101, see FIG. 1D). This is because the height of the lower side of the former gate insulating film 104 differs from the height of the lower side of the latter gate insulating film 104 by the thickness of the insulating film 102 and the semiconductor layer 103. Thus, the height of the lower side of the gate insulating film 104 that forms a part of the logic transistor is same with the height of the lower side of the insulating film 102 (that is, the height of the interface between the insulating film 102 and the substrate 101, see FIG. 1C). The "height" used herein means the "height" in the vertical direction in the plane of FIGS. 1C and 1D.

Second Embodiment

Figure 10:
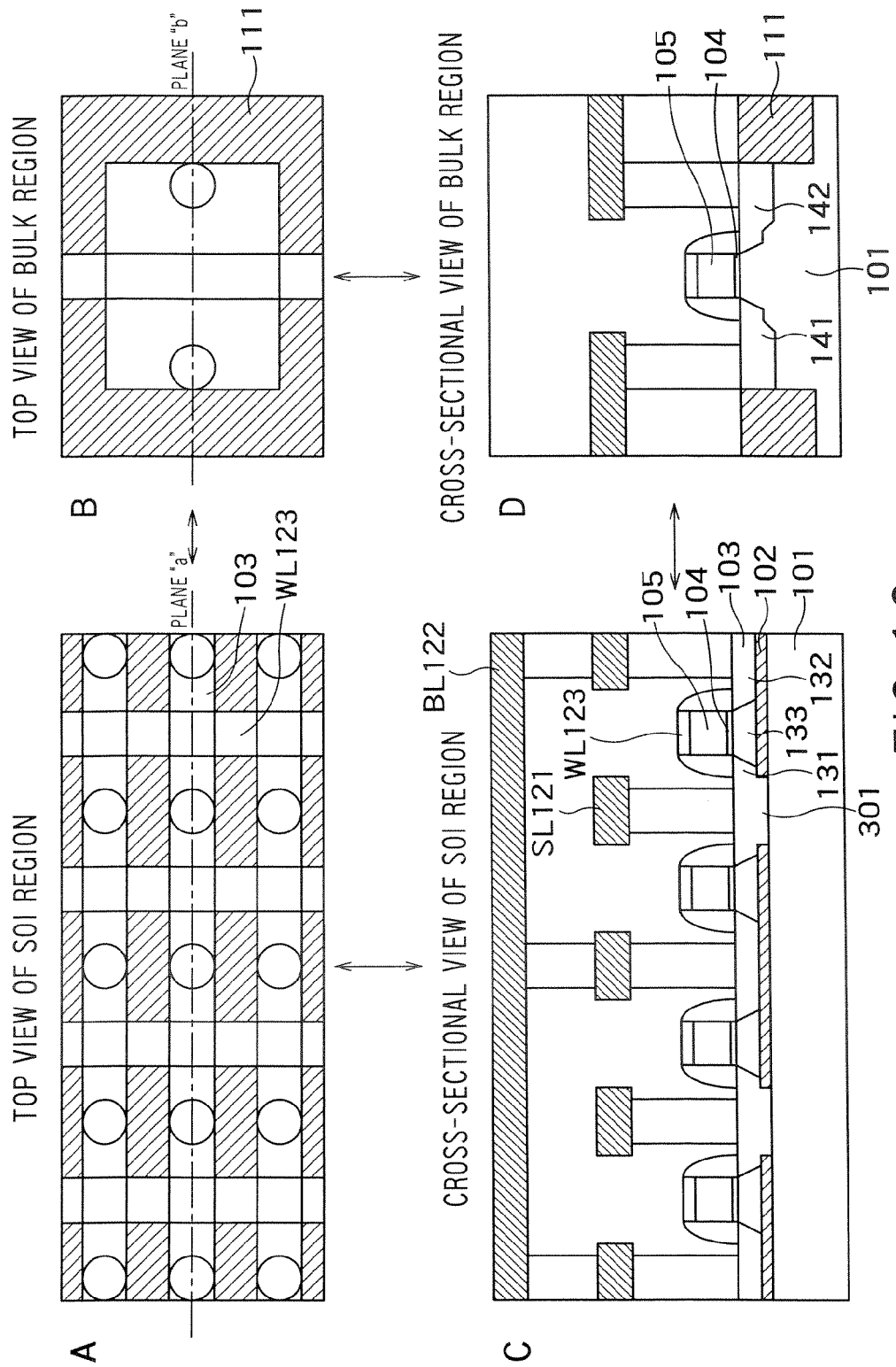
FIG. 10 shows the semiconductor memory device according to the second embodiment.

FIG. 10 shows a semiconductor memory device according to a second embodiment. FIGS. 10A and 10B correspond to top views of the semiconductor memory device. FIGS. 10C and 10D correspond to cross-sectional views of the semiconductor memory device taken along the planes "a" and "b", respectively.

Differences between the first and second embodiments will be described.

The insulating film 102 is formed between the substrate 101 and the semiconductor layer 103, by forming the base layer (which will be described later) on the substrate 101; removing a part of the base layer; after removing the part of the base layer, forming the semiconductor layer 103 on the base layer; forming the trench that passes through the semiconductor layer 103 to the base layer; removing the remainder of the base layer by using the trench; and forming the insulating film 102 in the cavity created by the removal of the remainder of the base layer. The insulating film 102 is a buried oxide film (BOX film) formed between the substrate 101 and the semiconductor layer 103 in such a process. The base layer corresponds to a specific example of a to-be-removed layer that is formed on the condition that the layer is removed later.

The region where a part of the base layer is removed has the semiconductor layer 103 subsequently formed on the base layer. This region is illustrated in FIG. 10 as a substrate connection region 301 of the semiconductor layer 103. As shown in FIG. 10, the semiconductor layer 103 is connected to the substrate 101 in the substrate connection region 301. As shown in FIG. 10, the substrate connection region 301 is located below the source region 131 (source line 121) in the semiconductor layer 103 as viewed in the vertical direction, and located sideways to the insulating film 102 as viewed in the horizontal direction. In other words, the semiconductor layer 103 has a portion formed above the substrate 101 in the SOI region via the insulating film 102 and a portion directly formed on the substrate 101 in the SOI region without the interposed insulating film 102. That is, the semiconductor layer 103 includes a portion that is deposited on the insulating film 102 (stacked portion) and a portion that is not deposited on the insulating film 102 (non-stacked portion). The latter non-stacked portion corresponds to the substrate connection region 301 and the overlying portion thereof, and the former stacked portion corresponds to the remainder of the semiconductor layer 103.

The presence of the substrate connection region 301 is useful when the cavity is created in the course of the formation of the insulating film 102. In a manufacturing process (such as wet washing) performed in a period from the creation of the cavity to the removal thereof, pattern distortion may occur due to the cavity because the semiconductor layer 103 floats in the direction the bit line 122 extends. However, in this embodiment, since the semiconductor layer 103 (upper-side layer) that forms the upper side of the cavity and the substrate 101 (lower-side layer) that forms the lower side of the cavity are connected in the substrate connection region 301 (the region connecting the upper-side and lower-side layers), the possibility of pattern distortion due to the cavity is reduced. In other words, the substrate connection region 301 serves as sort of a column supporting the cavity.

If there is no substrate connection region 301, the semiconductor layer 103 will float by, for example, about the distance between both ends of the bit line 122 (100 μm, for example), while with the substrate connection region 301, the floating distance may be reduced to, for example, about the distance between the source lines 121 (0.5 μm, for example).

In this embodiment, the substrate 101 is made of a semiconductor material of a first conductivity type (p-type Si, in this embodiment), while the substrate connection region 301 in the semiconductor layer 103 is made of a semiconductor material of a second conductivity type (n-type Si, in this embodiment). That is, the connecting surface between the substrate 101 and the semiconductor layer 103 is a pn junction. Therefore, the substrate 101 and the semiconductor layer 103 can be electrically separated by applying a reverse bias voltage For example, the electrical potential of the substrate 101 may be −2 V, while the electrical potential of the semiconductor layer 103 may be ±0 V (ground level). In this embodiment, the source regions 131, 141 and the drain regions 132, 142 are made of the semiconductor material of the second conductivity type (n-type Si, in this embodiment), while the body region 133 is made of the semiconductor material of the first conductivity type (p-type Si, in this embodiment).

In the semiconductor memory devices of the first and second embodiments, some other layer may be interposed between the substrate 101 and the insulating film 102 and/or between the insulating film 102 and the semiconductor layer 103. In fact, in the semiconductor memory device of the second embodiment, a semiconductor layer 401 is interposed between the insulating film 102 and the semiconductor layer 103, as described later. In this case, the insulating film 102 is present between the substrate 101 and the semiconductor layers 401 and 103, so that the upper-side and lower-side layers of the cavity are the semiconductor layer 401 and the substrate 101, respectively. When it is necessary to distinguish the semiconductor layer 401 and the semiconductor layer 103, the semiconductor layers 401 and 103 are referred to as first and second semiconductor layers 401 and 103, respectively.

FIGS. 11 to 19 show a method for manufacturing the semiconductor memory device according to the second embodiment. FIGS. A and B in each of the figures correspond to top views of the semiconductor memory device. FIGS. C, D, E and F in each of the figures correspond to cross-sectional views of the semiconductor memory device taken along the planes "a", "b", "c" and "d", respectively.

Figure 11:
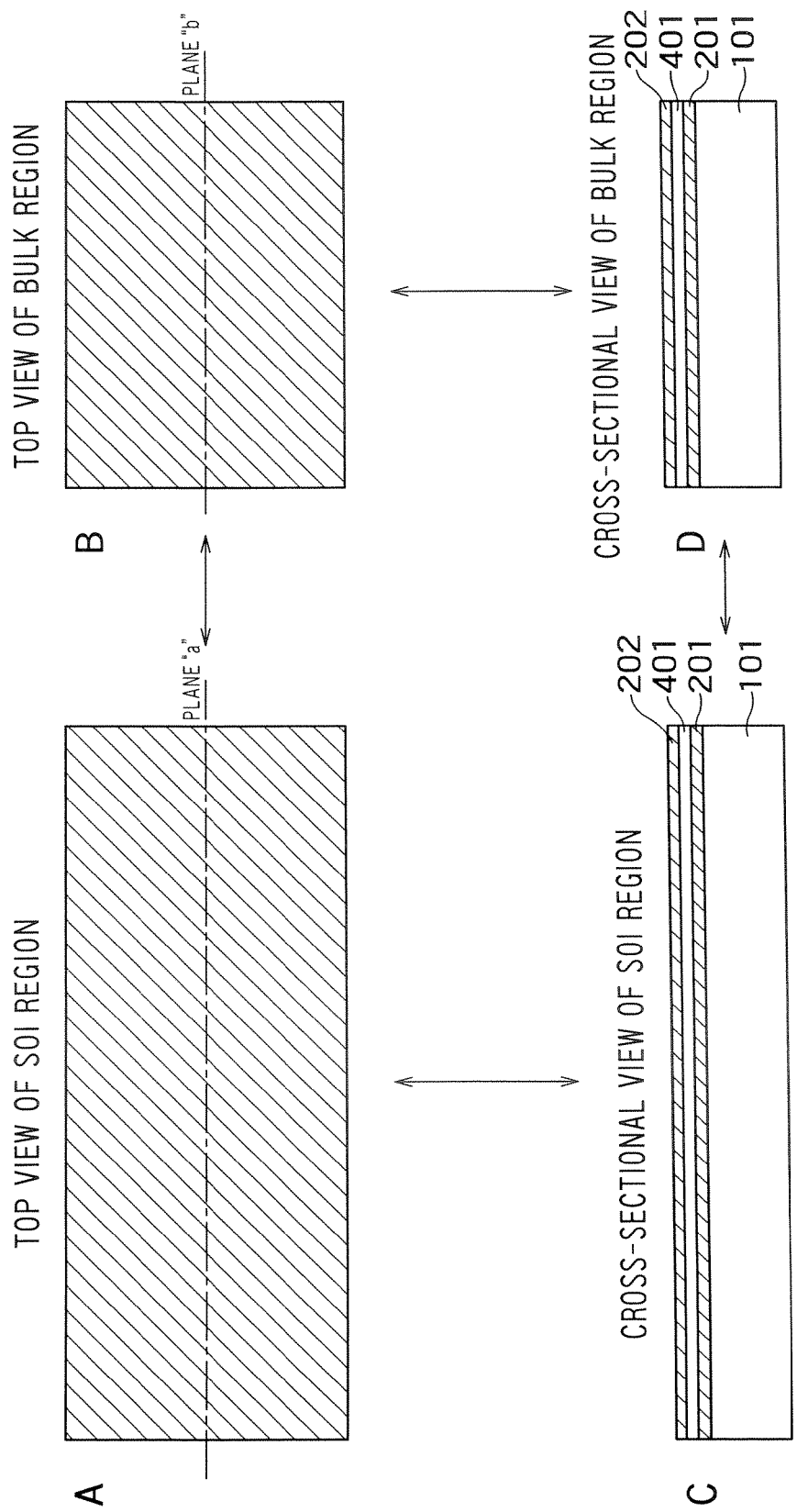
FIG. 11 shows the first stage (1/9) of the method for manufacturing the semiconductor memory device according to the second embodiment.

Firstly, as shown in FIG. 11, a base layer 201 made of SiGe (silicon germanium) is epitaxially grown over the substrate 101 made of Si (silicon). The base layer 201 serves as an underlying layer of layers formed above the substrate 101. The substrate 101 and the base layer 201 serve as a base of layers formed on the base layer 201 on the substrate 101. The layer thickness of the base layer 201 is 25 nm in this embodiment. The molar composition ratio of Si to Ge in the base layer 201 is 70%-80% to 30%-20% in this embodiment. Subsequently, as shown in FIG. 11, the (first) semiconductor layer 401 (different from the second semiconductor layer 103) made of Si is epitaxially grown over the base layer 201 made of SiGe. The layer thickness of the semiconductor layer 401 is 20 nm in this embodiment. Then, as shown in FIG. 11, a mask material (silicon nitride film) 202 is deposited over the semiconductor layer 401 in order to form the SOI and bulk regions and a region that becomes the substrate connection region 301.

Figure 12:
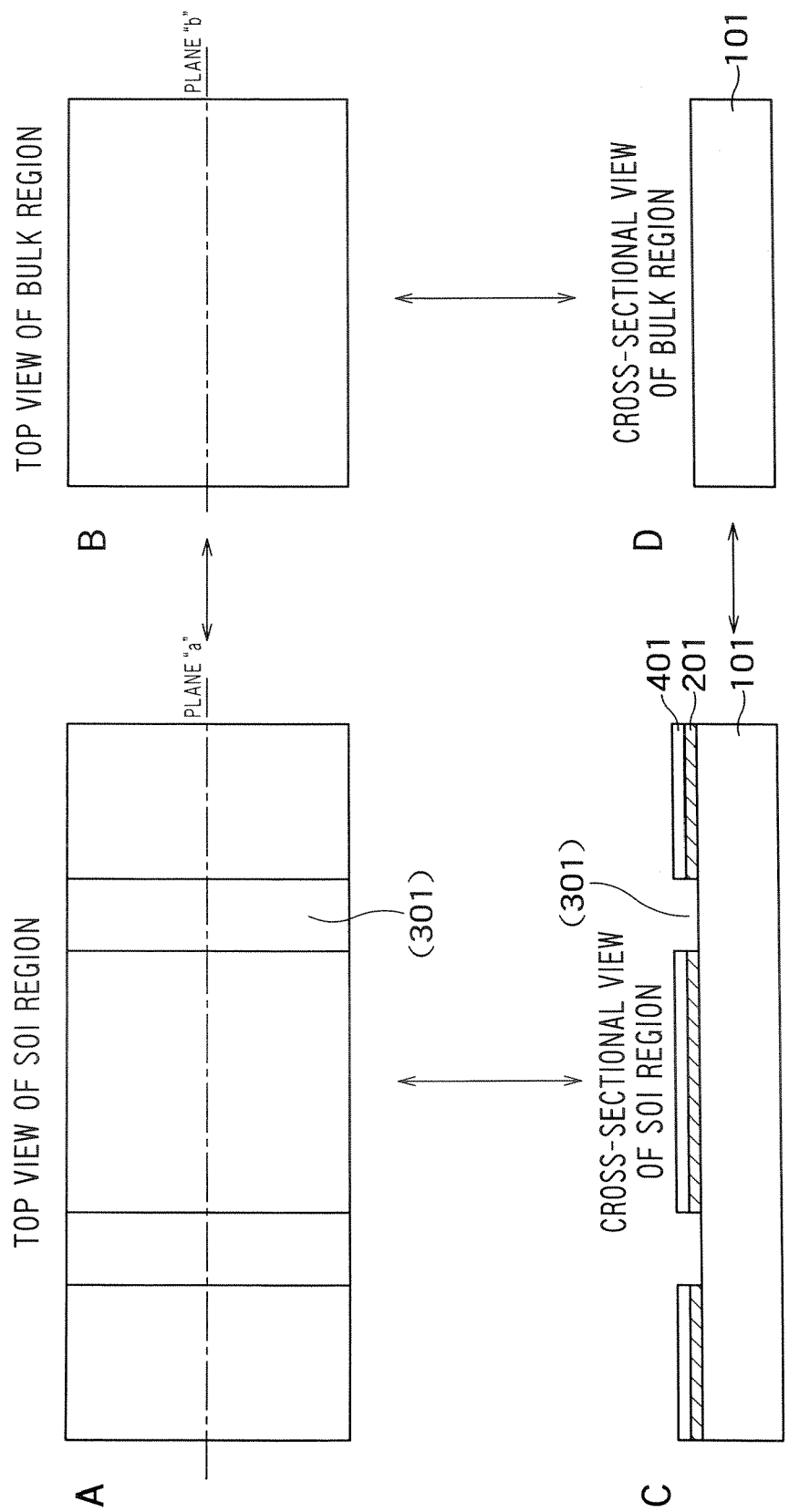
FIG. 12 shows the second stage (2/9) of the method for manufacturing the semiconductor memory device according to the second embodiment.

Thereafter, the mask material 202 is removed from the bulk region and the region that becomes the substrate connection region 301 by lithography and RIE (reactive ion etching). Then, by RIE using the mask material 202 as a mask, the semiconductor layer 401 and the base layer 201 are etched away from the bulk region and the region that becomes the substrate connection region 301, in order to expose the surface of the substrate 101 in the bulk region and the region that becomes the substrate connection region 301. Subsequently, as shown in FIG. 12, the mask material 202 remaining in the SOI region is removed.

Figure 13:
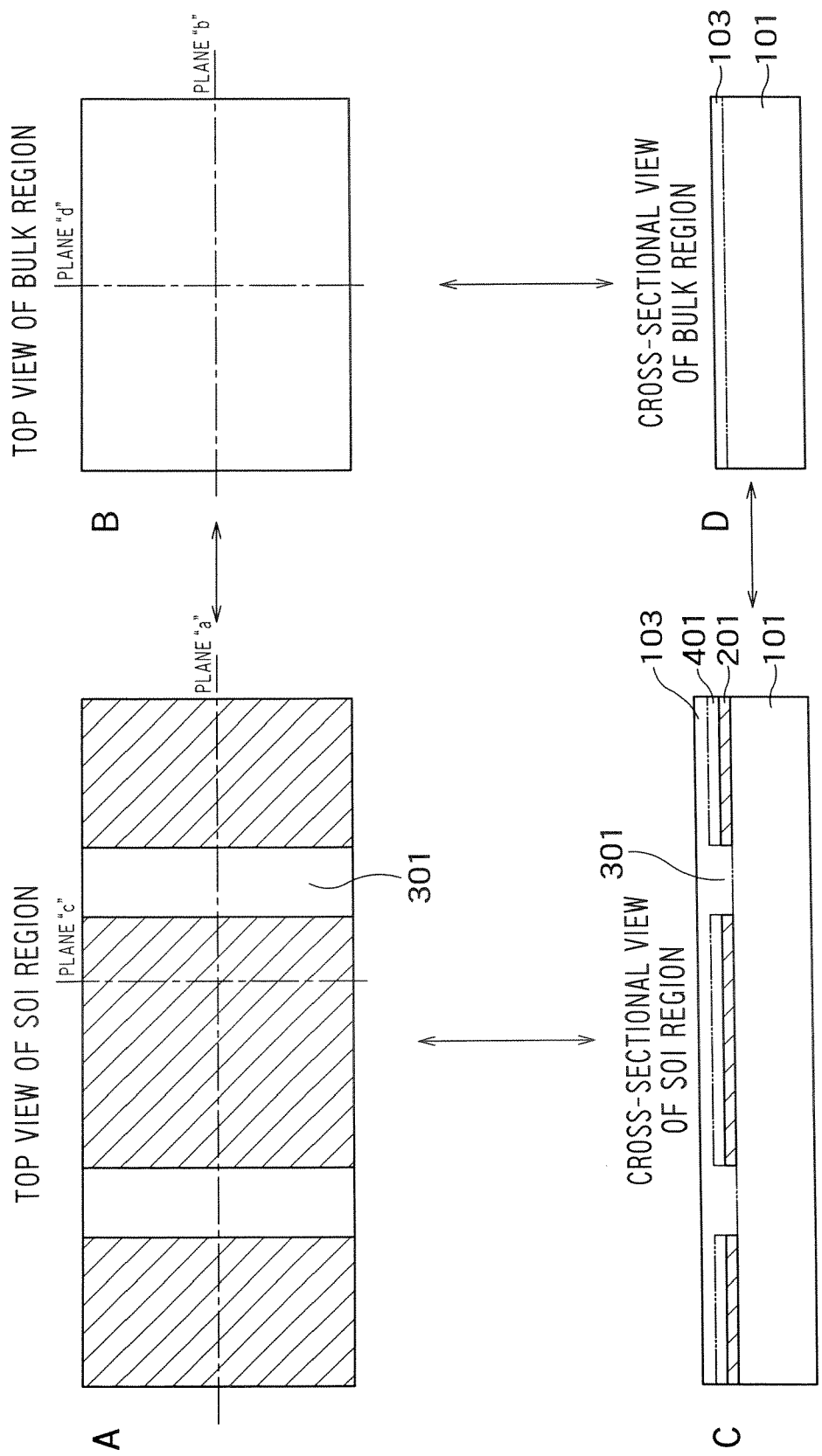
FIG. 13 shows the third stage (3/9) of the method for manufacturing the semiconductor memory device according to the second embodiment.

Thereafter, as shown in FIG. 13, the semiconductor layer 103 made of Si is grown over the semiconductor layer 401 in the SOI region and the substrate 101 in the bulk region. The layer thickness of the semiconductor layer 103 is 20 nm in this embodiment. In the SOI region other than the region that becomes the substrate connection region 301, the semiconductor layer 103 is formed on the semiconductor layer 401, while in the bulk region and the region that becomes the substrate connection region 301, the semiconductor layer 103 is formed on the substrate 101. Thus, the substrate connection region 301 is formed in the semiconductor layer 103.

Figure 14:
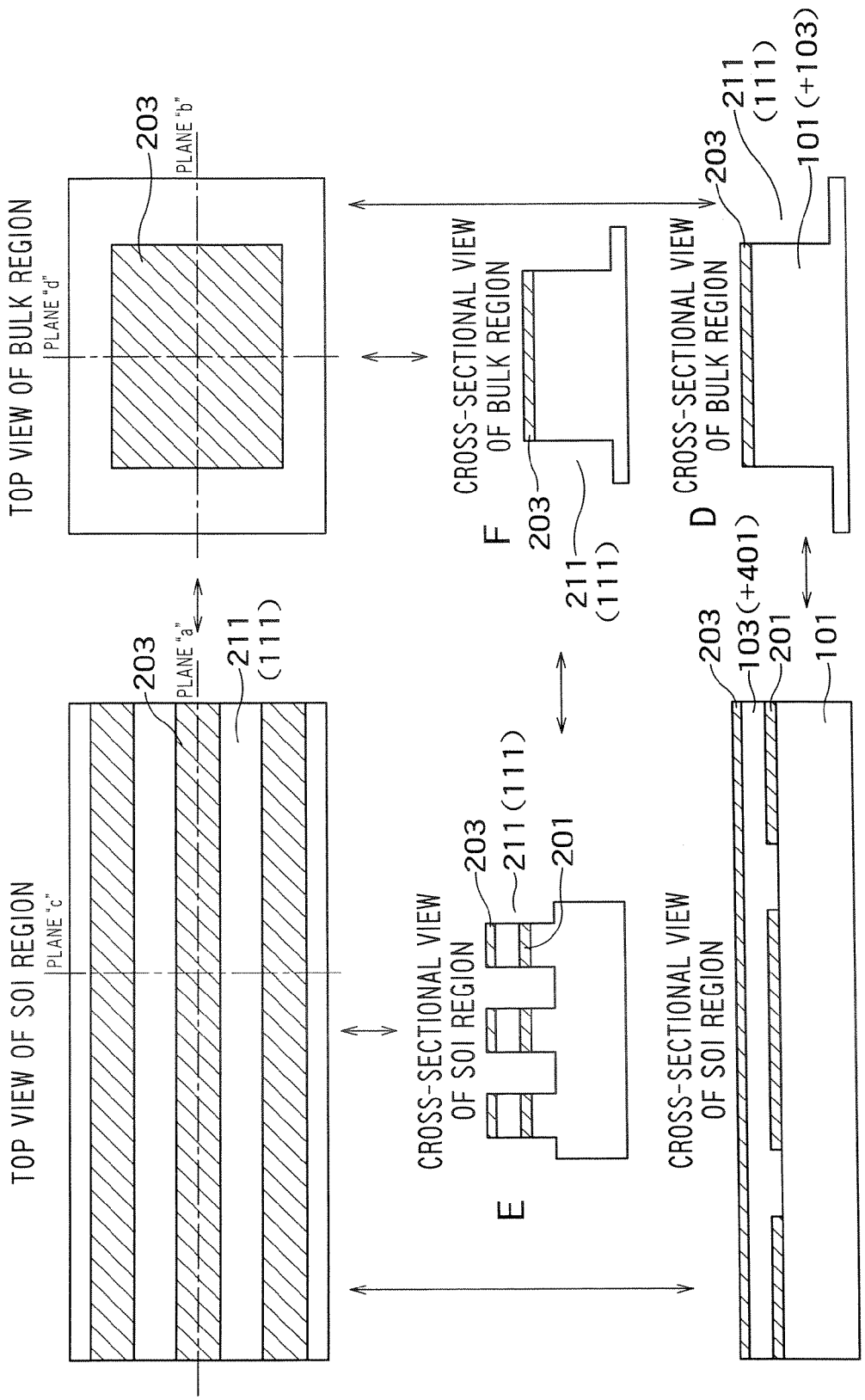
FIG. 14 shows the fourth stage (4/9) of the method for manufacturing the semiconductor memory device according to the second embodiment.

Thereafter, as shown in FIG. 14, a mask material (silicon nitride film) 203 is deposited over the semiconductor layer 103 in the SOI region and (on the semiconductor layer 103) above the substrate 101 in the bulk region in order to form the trench 211 for the STI layer 111. Then, as shown in FIG. 14, the mask material 203 is removed from the region that becomes the trench 211 for the STI layer 111 by lithography and RIE. Then, as shown in FIG. 14, by RIE using the mask material 203 as a mask, the semiconductor layer 103, (the semiconductor layer 401), base layer 201 and substrate 101 are etched away from that region to form the trench 211 that passes through the semiconductor layer 103, (the semiconductor layer 401) and the base layer 201 in that region. This exposes the base layer 201 at the sides of the trench 211 in the SOI region. At this time, the trench 211 may or may not pass through the base layer 201 as long as the trench 211 reaches the base layer 201.

Figure 15:
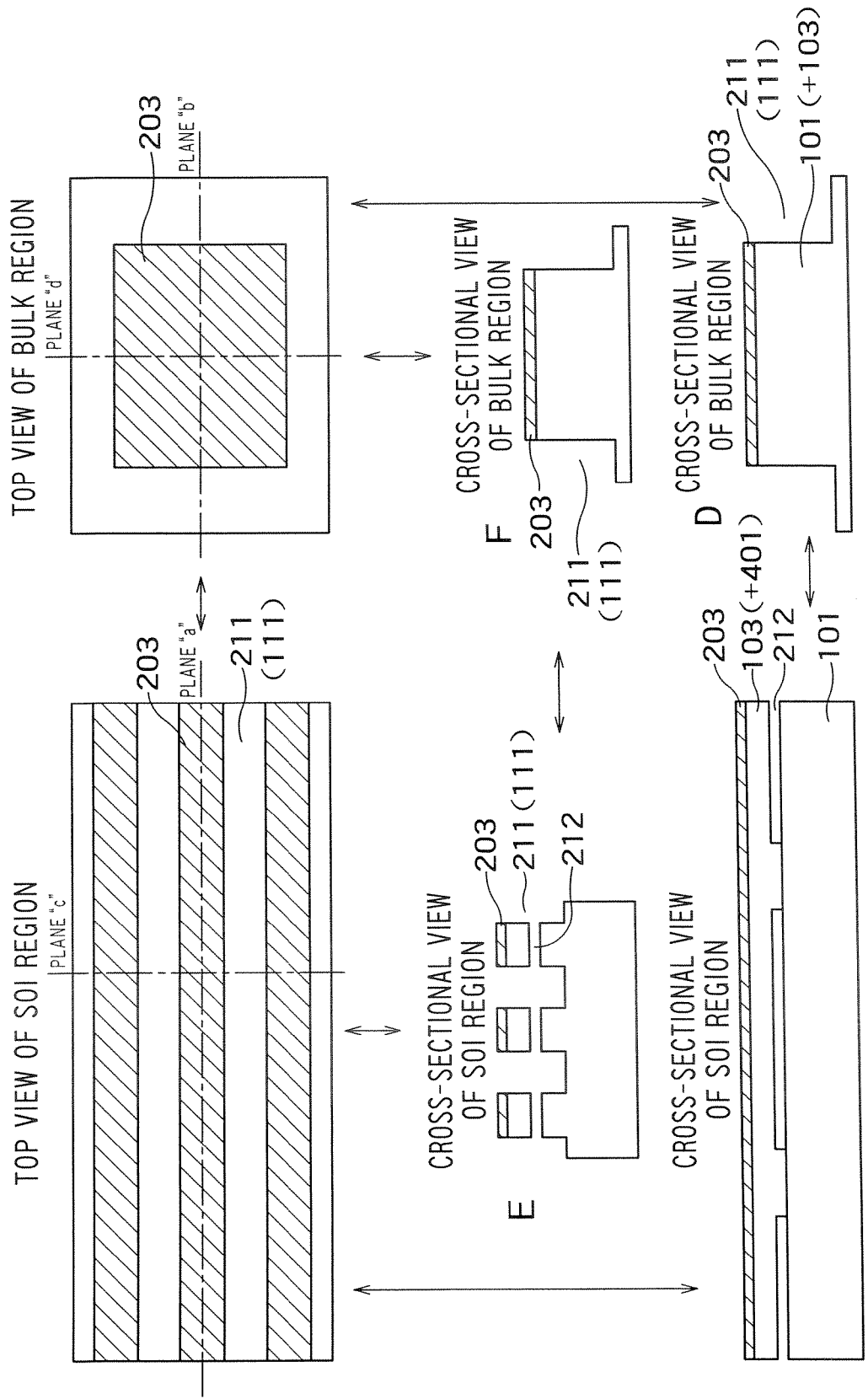
FIG. 15 shows the fifth stage (5/9) of the method for manufacturing the semiconductor memory device according to the second embodiment.

Thereafter, as shown in FIG. 15, the base layer 201 is etched away by using the trench 211 that passes through the semiconductor layer 103, (the semiconductor layer 401) and the base layer 201. In this embodiment, the substrate 101 is immersed in an etchant to etch away the entire base layer 201 from the sides of the trench 211 in the SOI region. In this embodiment, the etchant is a mixed aqueous solution containing 40 volumetric parts of 70% concentration nitric acid aqueous solution, 1 volumetric part of 49% concentration hydrofluoric acid aqueous solution, 2 volumetric parts of 99.9% concentration acetic acid aqueous solution and 57 volumetric parts of water (see, S. M. Kim, et al., ECS, The proceedings of the 11th International Symposium on SOI Technology and Devices, page 81, 2003). Thus, the cavity 212 is formed between the substrate 101 and the semiconductor layer 103 (between the substrate 101 and the semiconductor layers 401 and 103) in the SOI region.

Figure 16:
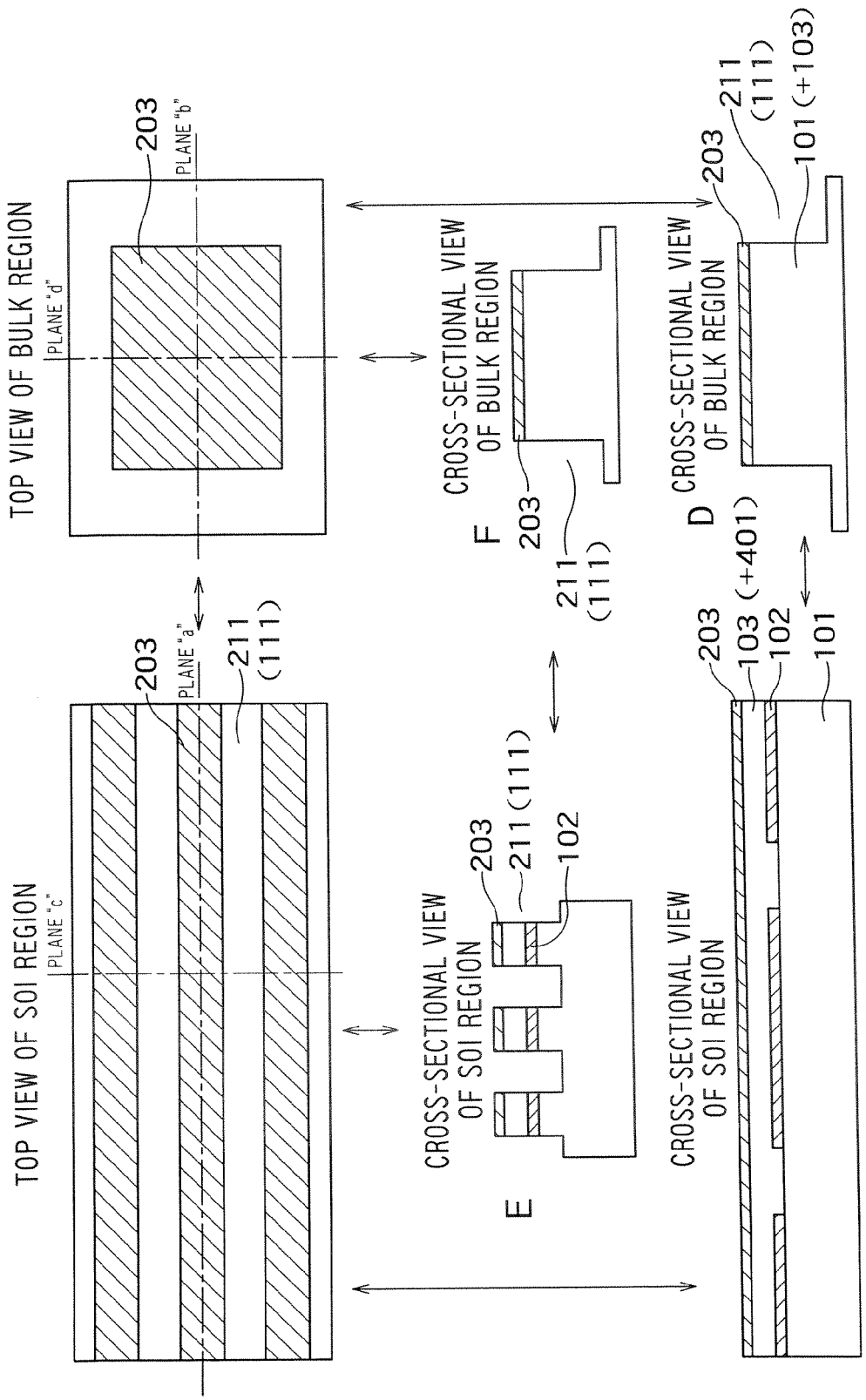
FIG. 16 shows the sixth stage (6/9) of the method for manufacturing the semiconductor memory device according to the second embodiment.

Thereafter, as shown in FIG. 16, the entire surface is oxidized to grow silicon oxide films on the surfaces of the cavity 212 and the trench 211 in the SOI region. This silicon oxide film is the insulating film 102 described above. In this embodiment, the cavity 212 in the SOI region can be completely filled with the silicon oxide film by setting the film thickness thereof to 13 nm. Thus, the insulating film 102 is formed in the cavity 212 between the substrate 101 and the semiconductor layer 103 (between the substrate 101 and the semiconductor layers 401 and 103) in the SOI region.

Figure 17:
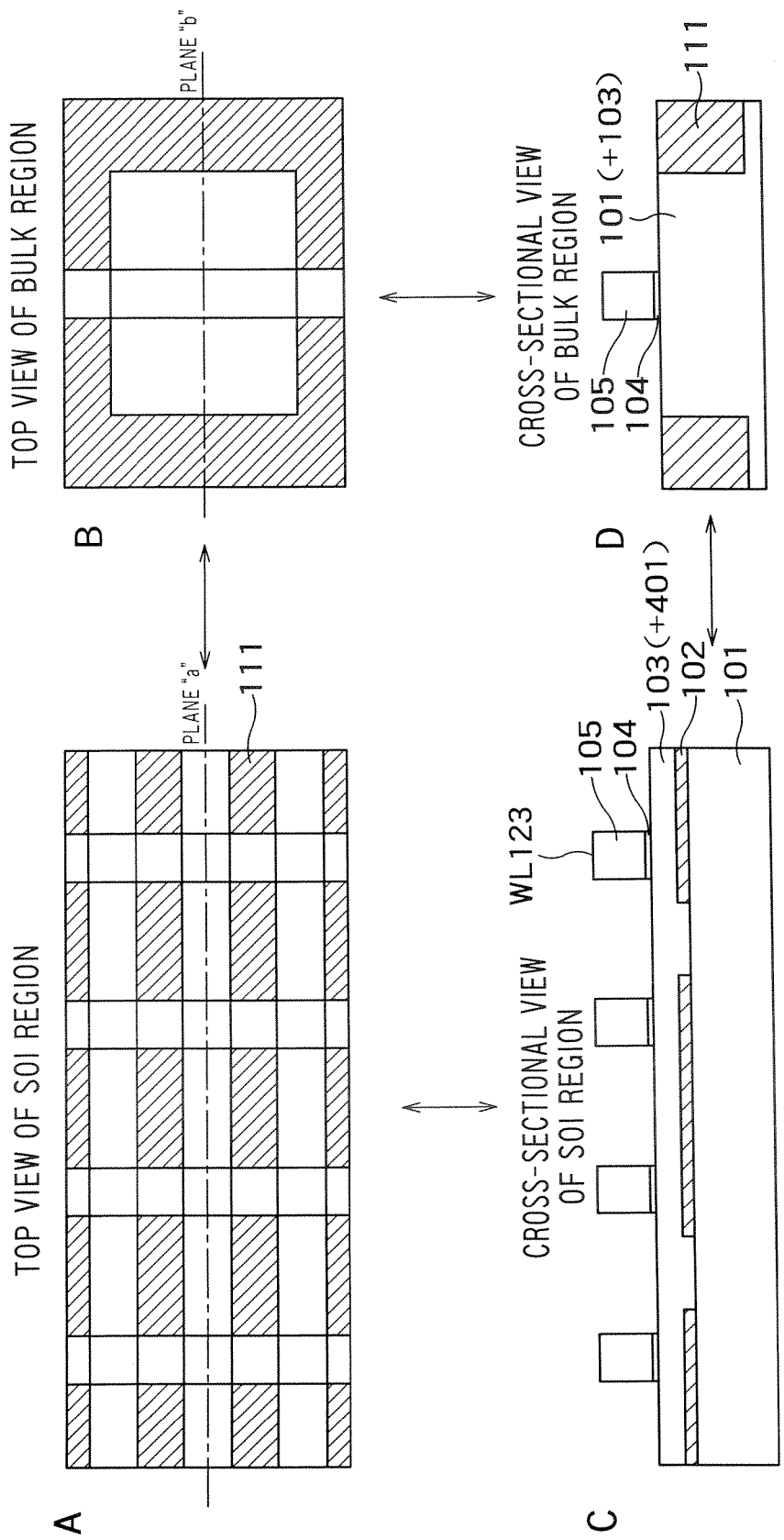
FIG. 17 shows the seventh stage (7/9) of the method for manufacturing the semiconductor memory device according to the second embodiment.
Figure 18:
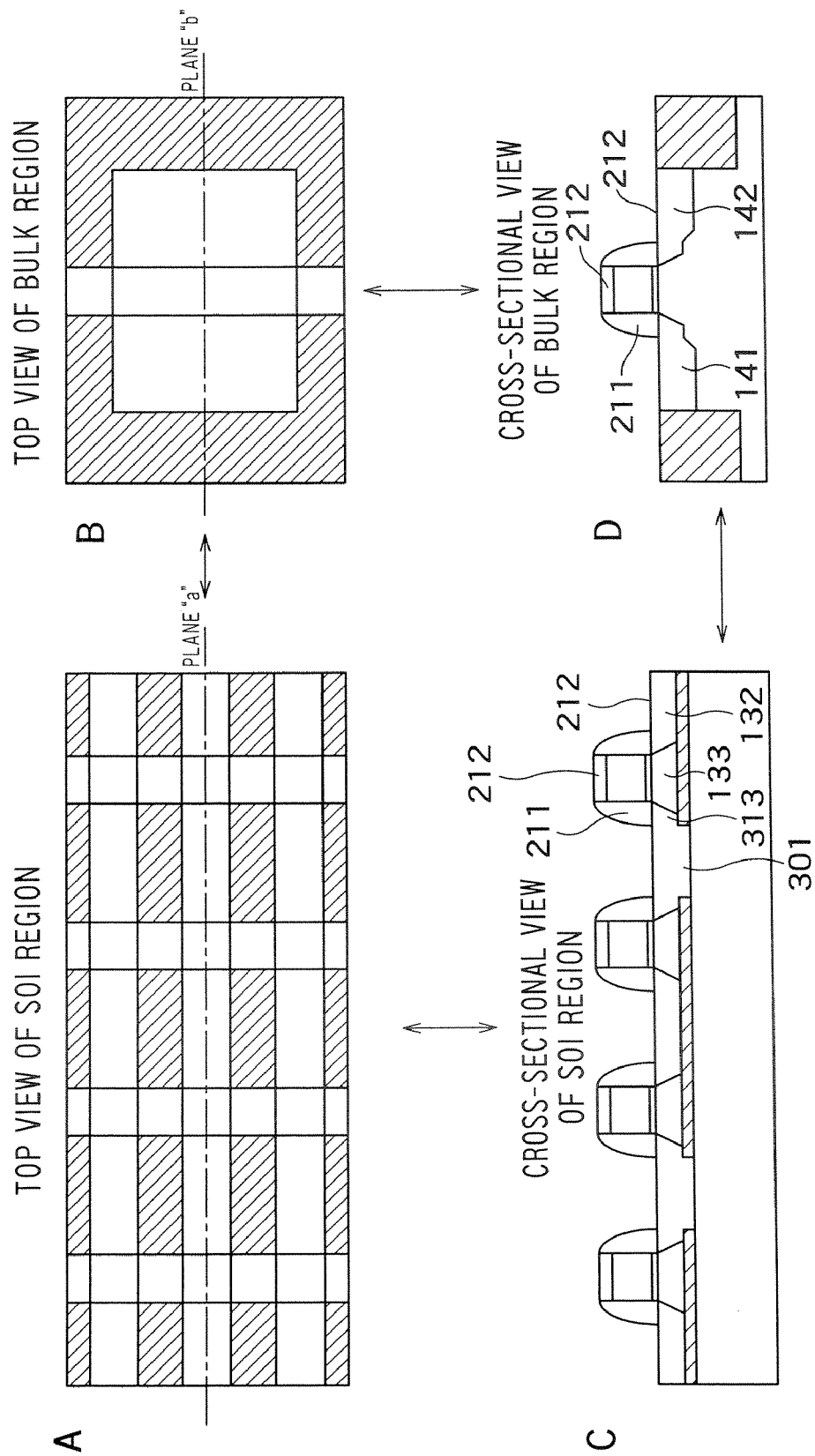
FIG. 18 shows the eighth stage (8/9) of the method for manufacturing the semiconductor memory device according to the second embodiment.
Figure 19:
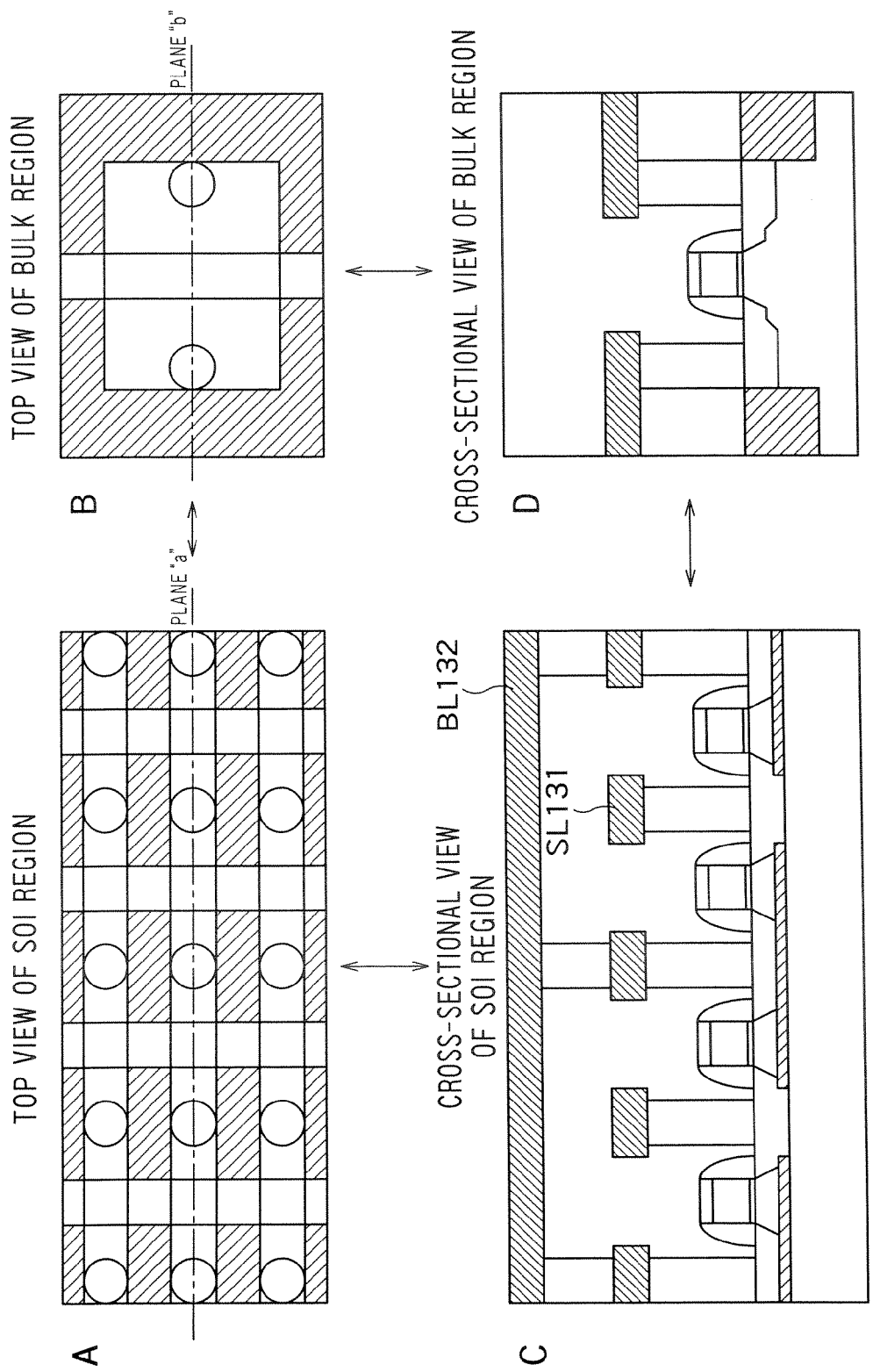
FIG. 19 shows the ninth stage (9/9) of the method for manufacturing the semiconductor memory device according to the second embodiment.

Thereafter, as shown in FIG. 17, the STI layer 111 is formed by burying and planarizing the silicon oxide film in the trench 211 for the STI layer 111. In this process, the mask 203 is also removed. Then, as shown in FIG. 17, a silicon oxide film and polycrystalline silicon are deposited, and lithography and RIE are used to form the gate insulating film 104 and the gate electrode 105 (word line 123). Subsequently, as shown in FIG. 18, n-type source and drain regions 131 and 132 as well as the n-type substrate connection region 301 are formed in the semiconductor layers 103 and 401 in the SOI region, and n-type source and drain regions 141 and 142 are formed in the substrate 101 and the semiconductor layer 103 in the bulk region. Then, as shown in FIG. 18, LDD side walls 221 and a CoSi film 222 are formed. Subsequently, as shown in FIG. 19, the source line 121 and the bit line 122 are formed. Thus, MOSFETs are formed on the semiconductor layer 103 in the SOI region and on the substrate 101 in the bulk region.

Thus, the embodiments of the present invention propose processes that provide a semiconductor memory device formed of a substrate such as an SOI substrate, having a region such as an SOI region (a substrate having a region where a semiconductor layer is present on an insulating film).

What is claimed is:

1. A method for manufacturing a semiconductor device comprising:
   forming a to-be-removed layer on a semiconductor substrate;
   forming a semiconductor layer on the to-be-removed layer in order to form an SOI region and a bulk region on the semiconductor substrate;
   removing the semiconductor layer and the to-be-removed layer in the bulk region to expose the semiconductor substrate below the bulk region;
   forming a trench that passes through the semiconductor layer to the to-be-removed layer in the SOI region;
   removing the to-be-removed layer by using the trench and forming a cavity; and
   forming an insulating film in the cavity.

2. The method for manufacturing a semiconductor device according to claim 1, etching away the to-be-removed layer from the sides of the trench, by immersing the semiconductor substrate in an etchant.

3. The method for manufacturing a semiconductor device according to claim 1, forming the insulating film which is a silicon oxide film in the cavity, by oxidizing the surface of the cavity.

4. The method for manufacturing a semiconductor device according to claim 1, wherein the to-be-removed layer is a silicon germanium layer.

5. The method for manufacturing a semiconductor device according to claim 1, further comprising:
   forming a memory cell on the semiconductor layer in the SOI region; and
   forming a logic transistor on the exposed semiconductor substrate in the bulk region.

6. The method for manufacturing a semiconductor device according to claim 5, wherein the memory cell is a capacitor-less memory cell.

7. The method for manufacturing a semiconductor device according to claim 6, further comprising:
   forming a region for storing signal charges in the semiconductor layer on the insulating film in the SOI region.

* * * * *